Dec. 21, 1965 J. H. DOYLE 3,225,347
ANALOG DIGITAL CONVERTER
Filed Feb. 28, 1962 4 Sheets-Sheet 1

INVENTOR.
JAMES H. DOYLE
BY
Christie, Parker & Hale
ATTORNEYS.

INVENTOR.
JAMES H. DOYLE
BY Christie, Parker & Hale
ATTORNEYS.

ANALOG DIGITAL CONVERTER

Filed Feb. 28, 1962 4 Sheets-Sheet 3

INVENTOR.
JAMES H. DOYLE
BY
Christie, Parker & Hale
ATTORNEYS.

INVENTOR.
JAMES H. DOYLE
BY
Christie, Parker & Hale
ATTORNEYS.

United States Patent Office 3,225,347

Patented Dec. 21, 1965

3,225,347
ANALOG DIGITAL CONVERTER

James H. Doyle, Garden Grove, Calif., assignor to General Data Corporation, Orange, Calif., a corporation of California Filed Feb. 28, 1962, Ser. No. 176,216
7 Claims. (Cl. 340—347)

This invention relates to analog to digital converters and, more particularly to a converter utilizing an electronic comparator arrangement for digitizing an analog signal.

This invention is related to my earlier filed application entitled Electronic Quantizer, bearing Serial No. 172,377, and filed on February 5, 1962, now abandoned.

Analog to digital converters as presently known have taken various forms as represented by encoders or shaft position digitizers and purely electronic converters. It will be recognized that the shaft position digitizer is an essentially mechanical device and the response time or switching time therefore is dependent upon the encoder's shaft speed to which the encoding element is generally fixed. In addition, the life of these shaft position digitizers is limited, particularly when the sliding contact type of encoder is employed, in contrast with the life of the purely electronic converter. In general, the number of electronic components required for an electronic converter is substantial, resulting in a relatively complex conversion device. A common class of electronic converters is based on the comparison of an input voltage with a locally generated voltage which is altered by a control circuit until the two voltages agree. The state of the locally generated voltage at the time of agreement is read out in digital form and thus furnishes the desired digital output. A common form of control circuit for this type of digitizer employs a counter to provide a digitized output. This conversion technique necessarily involves a large number of electronic components.

The present invention provides a simple and improved analog to digital converter utilizing a voltage comparison technique that is more economical than prior art devices and utilizes a minimum of standard and reliable electronic components leading to the construction of a complete solid state converter having improved switching rates in the megacycle range.

From a structural standpoint, the invention comprises a plurality of voltage comparison elements having a voltage biased input circuit. The bias value for each comparison element corresponds to the digit in a preselected number system that the associated comparison element is to represent. The analog signal to be digitized is applied to each of the input circuits of the comparison elements whereby the comparison elements provide a digitized output indication only when the analog signal and bias voltage have a preselected voltage difference to trigger a voltage discriminating element of the comparator for providing the digital output indication. In addition, each of the input circuits is further characterized as including circuit means connected to be responsive to an output indication from a comparison element representing a higher digital value to each of the lower order digital representing comparison elements for modifying the bias voltages for each of these lower valued elements in accordance with the digital value of the comparison element providing an output indication to thereby indicate the correct digital output representation of the analog signal.

In one particular embodiment of the invention wherein the digital output is in terms of a binary code, the mentioned circuit means is connected into the input circuits for each of the comparison elements and comprises a binary weighted network for modifying the bias input voltages to each of the comparison elements. The binary weighted networks are so defined to cause only the comparison elements to indicate the correct binary coded output. Specifically, the bias values for each comparator input circuit are modified to correct the lower ordered comparison element to maintain them in either a nonconductive or conductive condition in accordance with the value of the analog signal to be digitized. Essentially then, the binary value of the analog signal that is indicated by a comparison element is subtracted from the analog signal and coupled to the lower ordered comparison elements and thereby subdividing the analog signal to be digitized. In this same fashion, the analog to digital converter of the present invention may be arranged in terms of cascaded stages for simultaneously indicating the digital value of an analog signal delivered to each comparison stage.

Another aspect of the invention is the unique control arrangement for the discriminators whereby they are all switched at approximately the same input signal level for a given temperature. The control arrangement comprises a single unit for all of the discriminators, regardless of the number, and which unit is characterized as a differential reference source.

These and other features of the present invention may be more fully appreciated when considered in the light of the following specification and drawings in which.

Figure 1:
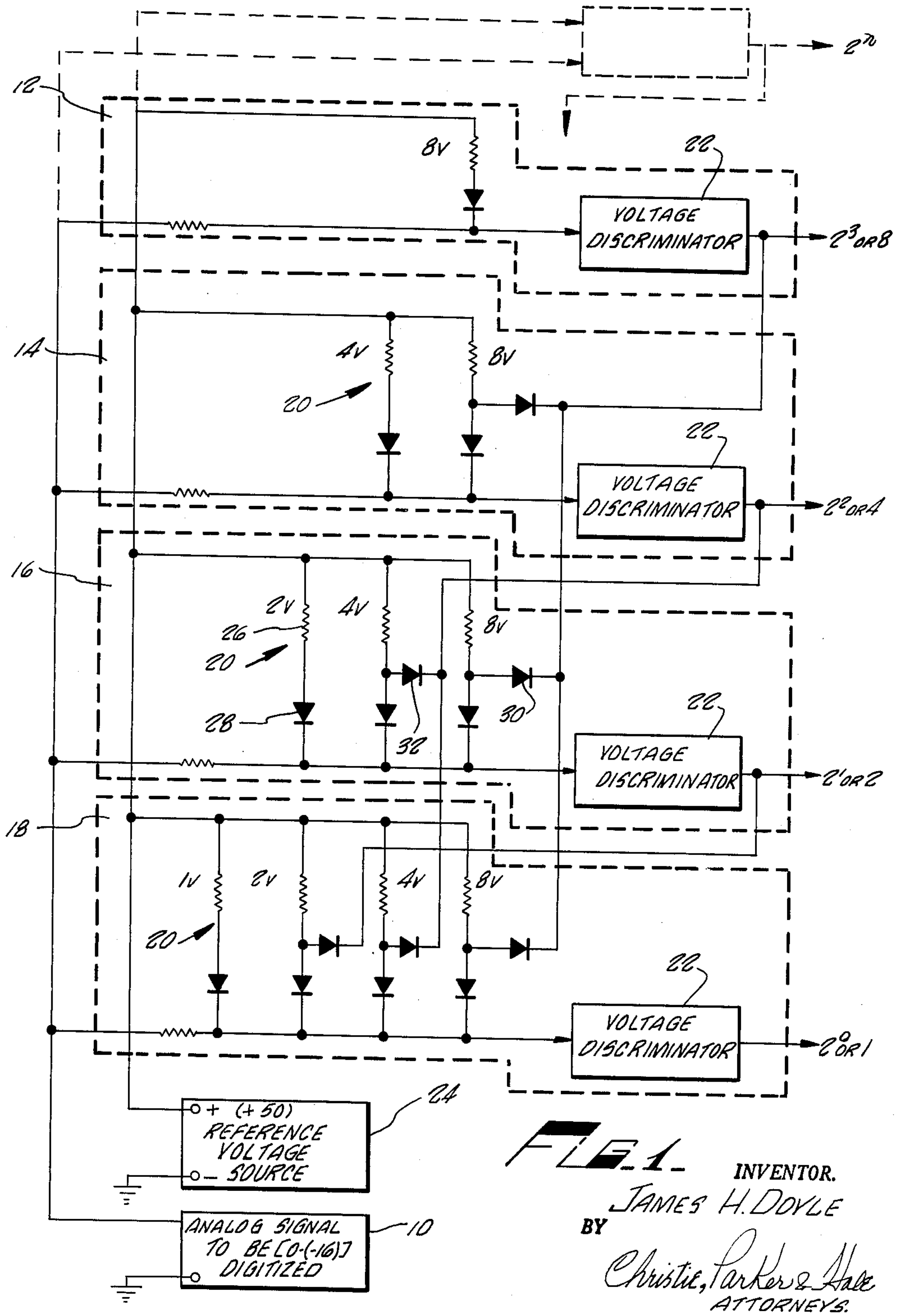
FIG. 1 is a block-circuit diagram of the analog to digital converter embodying the invention.

Now referring to FIG. 1, the analog to digital converter of the present invention will be examined. The invention is shown in FIG. 1 as it may be utilized for digitizing an analog signal in terms of four binary characters or bits shown as the binary characters $2^0$, $2^1$, $2^2$, and $2^3$ or the corresponding decimal digits 1, 2, 4, and 8 respectively. The analog signal to be digitized is shown as derived from a block 10 and is coupled to the four comparing circuits shown in dotted outline and identified by the reference numerals 12, 14, 16, and 18. Each of the comparators 12–18 comprise a binary weighted network, similar to the network identified by the reference character 20 for the comparator 16, and an individual voltage discriminator 22 coupled to receive the signal from their associated network. A source of reference voltage is represented by the block 24 and which reference voltage has its positive terminal shown connected to the input circuit for each of the weighted networks 20.

The weighted networks 20 for each comparator include a single arm that comprises an impedance element, shown as a resistive impedance element 26 for the comparator 16, which is coupled between the positive terminal of the reference voltage source 24 and the input circuit of the voltage discriminator 22 by means of a diode 28. The corresponding impedance element and its associated diode is shown as the left-hand arm of each network 20 for the other comparators 12, 14, and 18, all of these arms are arranged to be normally conductive to apply a preselected bias voltage to the input circuit of the voltage discriminator 22.

The preselected bias voltages provided by these arms differ in accordance with the binary weighting of the associated comparator. To this end, the bias voltages for the comparators 12–18 may be considered to provide positive potentials of 8, 4, 2 and 1 volts, respectively.

The networks 20 for each of the comparator circuits except the highest ordered binary stage, in this instance the comparator 12, have additional arms arranged in parallel circuit relationship with the described left-hand arms corresponding in number to the number of higher ordered comparison elements. Each of these arms are defined to be in a normally nonconductive condition and switched to a conductive condition for providing compensating or correction potential to the input circuit for the associated voltage discriminator 22, as will be described immediately hereinafter.

Specifically, examining the network 20 for the comparator 16, it will be seen that two arms are shown and which arms each include a resistive impedance element and a diode connected in series circuit arrangement in the same fashion as the left-hand arms and the series combination connected in parallel with these left-hand arms. The right-hand arm for this network 20 includes a diode 30 connected to a common point between the series resistive impedance element and the series diode and to the output circuit of the voltage discriminator 22 for the comparator 12, or the output indicating the binary value $2^3$. In the same fashion, the remaining arm of this network 20 includes a separate diode 32 connected to a common point between the impedance element and the diode and to the output of the voltage discriminator 22 for the comparator 14 or indicating the value of $2^2$. The circuit relationship is such that when a comparator is indicating the binary value 0, the current from the reference source 24 is passed from the resistive impedance element by means of the diodes 30 or 32 and when a binary one is indicated, the current is switched to the series diodes into the common bus for the input circuit of the voltage discriminator 22. The switching action of the parallel diodes in the networks 20 is more fully described and claimed in my above-mentioned copending application.

Each of the other binary weighted networks 20 include similarly defined arms corresponding to the number of higher ordered comparator elements that are coupled to the output circuits for each of the comparators for modifying the preselected bias voltage for the individual comparator. To this end, each arm for the networks 20 that is connected to the $2^3$ output circuit provides a bias voltage of approximately 8 volts, therefore each right-hand arm for the comparison elements 14, 16 and 18 has a +8 volts combined with the preselected positive bias potential only when the $2^3$ output is indicating a binary one.

It therefore should be recognized that each of the comparators except the comparator 14 is provided with at least a single arm that is normally nonconductive and is switched to a conductive state in accordance with the production of a binary one output indication from one of the comparators representing a higher binary order. The positive output voltages from the networks 20 are combined with a negative voltage applied from the source 10 or the analog signal to be digitized so that the signal applied to each of the voltage discriminators 22 is the difference between these voltages.

Figure 3:
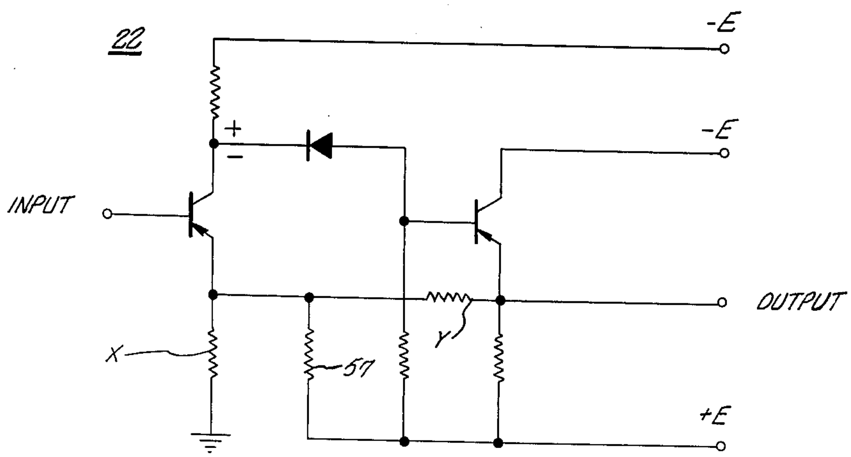
FIG. 3 is a circuit diagram of a voltage discriminator element for use in the converter of FIGS. 1 and 2.

The voltage discriminator 22 may be in the form of a conventional transistorized Schmitt trigger circuit having a circuit configuration as shown in FIG. 3. The Schmitt trigger circuit is well known in the art, both the transistor and tube version thereof. The circuit is shown and described in the text entitled, "Notes on Analog-Digital Conversion Techniques," edited by Alfred K. Susskind, published in 1957 by Massachusetts Institute of Technology and John Wiley & Sons, Inc. of New York, on pages 5–7 through 5–9. Suffice it to say for the purpose of this invention that the input transistor shown in FIG. 3 is normally in a nonconductive condition and is provided with an emitter follower stage that is normally conductive to provide a negative output potential indicative of a binary zero. The voltage discriminator 22 remains in this conductive condition as long as the input signal remains positive. When the input signal is zero or preferably goes slightly negative, the desired switching action occurs due to the positive feedback arrangement. The negative input potential causes the input transistor to become conductive and the emitter follower to be cut off whereby the output potential goes positive to indicate a binary one. The output potential remains positive while the input signal is negative and when it goes positive again, it returns to its original condition to indicate a binary zero. It should therefore be understood that each of the discriminators 22 normally indicate a binary zero and are switched to represent a binary one. Simultaneous with the switching of a discriminator to the binary one condition, the networks 20 are modified, as discussed hereinabove.

An important aspect of the discriminator 22 is the intentional inclusion of a hysteresis characteristic for the circuit arrangement shown in FIG. 3 leading to the snap action switching characteristic. This hysteresis characteristic is defined by the amount of positive feedback coupled from the output transistor to the input transistor. In terms of the circuit elements of FIG. 3 the amount of feedback is dependent on the ratios of the resistive impedances identified as $x$ and $y$ in FIG. 3. In a practical application of the discriminator 22, the feedback is controlled to provide a hysteresis characteristic that requires an input signal level of more than one-half of a bit or binary character to switch the discriminator 22, thus reducing the effect of power supply ripple and input noise.

With these circuit conditions in mind, a typical digitizing operation may be examined. When the analog signal to be digitized is zero, it will be recognized that each of the comparators 12–18 will provide a positive output indication or a binary zero, since the left-hand arms of networks 20 each provide a positive bias voltage. As the analog signal decreases in a negative direction and reaches a negative one volt, it will be seen that the difference between the minus one volt and the voltage provided by each of the left-hand arms for the comparators 12, 14, and 16 will be positive potential since each of these arms provide a potential greater than one volt. The left-hand arm of the network 20 for the comparator 18, however, provides a positive one volt and when combined with the negative one volt analog signal, provides essentially a zero input voltage and should be considered slightly negative for triggering the voltage discriminator 22 to provide a digital output indication from the comparator 18 to indicate a binary one corresponding to the one volt input signal. In terms of the binary notation, the output of the converter may be considered to read 1000, reading the least significant bit first.

Further assuming that the analog signal continues in a negative direction and reaches minus two volts, it will be seen that under these input conditions, an output indication will be derived from the comparator 16 since the two volts provided by the left-hand arm of this comparator cancels out the two volt input signal to cause the triggering of the voltage discriminator 22 and, accordingly, an output signal from the $2^1$ output circuit. During this same interval, however, it will be seen that the minus two volt analog signal would provide a binary one from the $2^0$ comparator 18 since the minus two volt analog signal is combined with the one volt signal from the left-hand arm of the comparator 18 to maintain the input signal to the voltage discriminator 22 of this comparator at a negative potential. However, due to the switching of the output potential of the $2^1$ output circuit, the series diode connected thereto is switched and its associated impedance element conducts into the input circuit for its associated discriminator 22 whereby a plus two volt drop is added into the network 20 whereby the combination of the two conductive arms for the network 20 of comparator 18 provide a plus three volt bias to be combined with the negative two volt analog signal to thereby render the input signal positive to switch the voltage discriminator 22 back into its normal condition whereby it indicates a binary zero. Therefore, wtih a minus two volt input signal, the output indication will correctly read 0100.

It should now be recognized that with the continuing increase of the analog signal towards a minus 16 volts (full scale), the correct digital output will be derived from the converter by causing the correct voltage discriminator 22 to be switched on and off. To this end, as the voltage increases from minus two to minus three, both of the $2^0$ and $2^1$ outputs will be switched to provide the binary output signal 1100. In the same fashion, as the voltage increases another increment to minus four volts, the output reads 0010. Any other binary value up to 16 can be digitized by this four element arrangement. It should be also recognized that although only four comparing elements are shown in FIG. 1, it may be extended to any number of elements whereby the same weighted network 20 is utilized as the input circuit for each voltage discriminator 22 except that an additional arm is added for each comparison stage added to the converter. Such an arrangement is diagrammatically shown by the dotted outline in FIG. 1 wherein the output is identified as $2^n$. It should be further noted that the comparators may be defined in terms of current discrimination as well.

Figure 2:
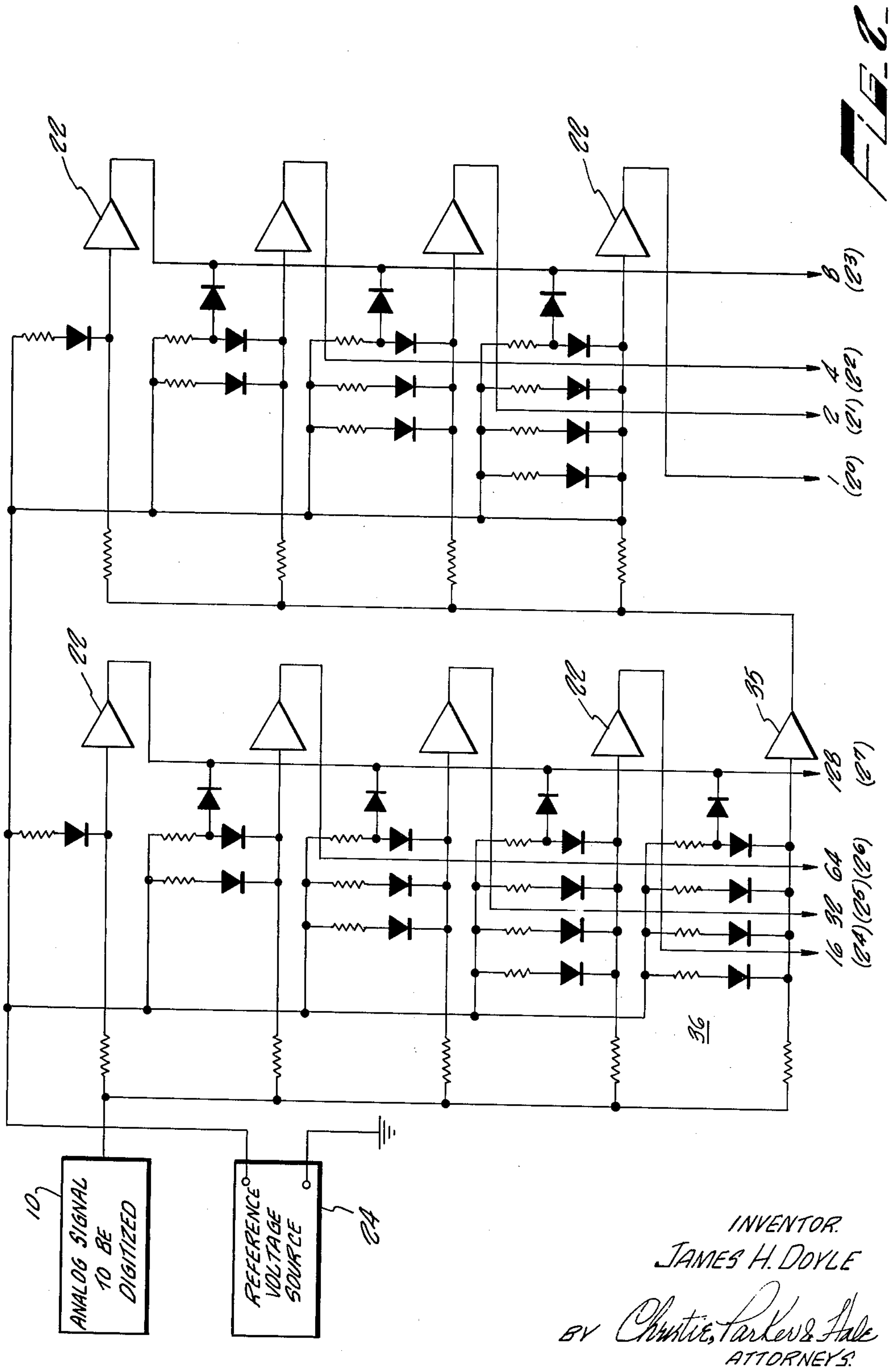
FIG. 2 is a block-circuit diagram of the comparator of FIG. 1 arranged as a plurality of cascaded comparison stages.

Now referring to FIG. 2, the converter of FIG. 1 is shown as arranged into series parallel comparing stages for extending the digital capacity. The converter of FIG. 2 is shown with a total of eight comparing elements whereby any binary coded digital output up to 256 may be obtained by the two series-parallel stages. The first stage or the left-hand group of comparing elements as shown in FIG. 2 comprises the highest order stage and is defined to indicate the binary values of $2^4$, $2^5$, $2^6$, and $2^7$, or in terms of the decimal system, the digits 16, 32, 64, and 128, respectively. The lower ordered stage or the right-hand portion of FIG. 2 comprises the second stage for indicating the binary values $2^0$, $2^1$, $2^2$, and $2^3$. The second stage will be recognized as producing the same binary output indications as described hereinabove for FIG. 1.

The comparison elements of the first and second stages are arranged in the same fashion as the comparator of FIG. 1. In this instance, however, the analog signal to be digitized is coupled merely to the first stage in a parallel circuit relationship. The reference voltage source 24, however, is coupled in a parallel circuit relationship to all of the comparison elements of both the first and second stages. The analog signal provided for the second stage is derived from a summing amplifier 35 which has its output circuit connected in parallel circuit relationship with each of the comparison elements for the second stage.

Figure 4:
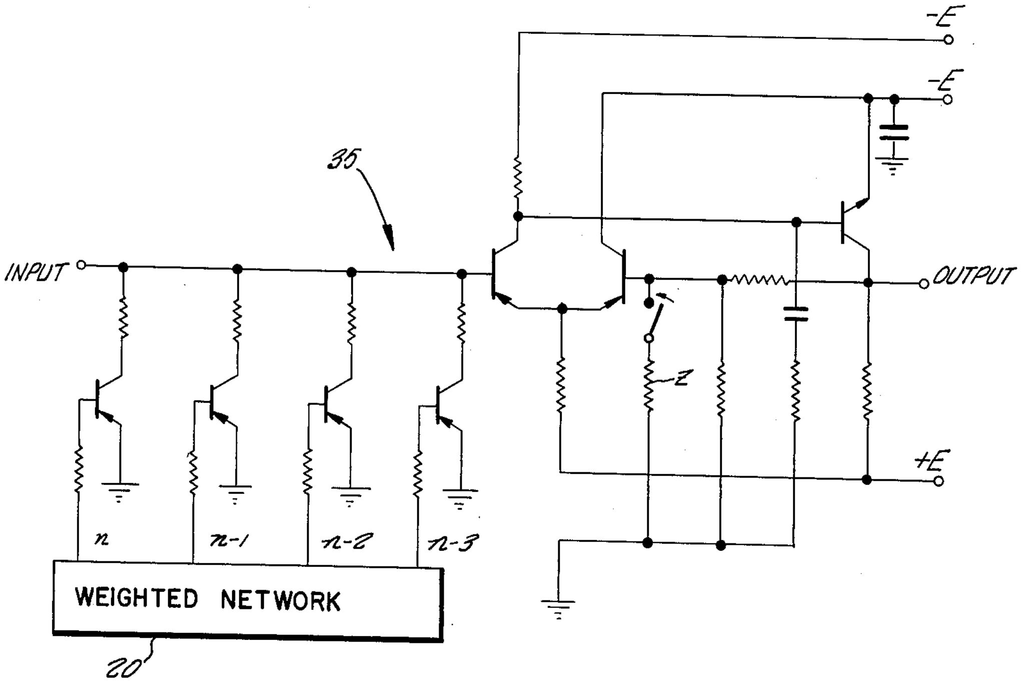
FIG. 4 is a circuit diagram of a typical summing amplifier for use in the converter of FIG. 2.

The summing amplifier 35 is arranged with an input circuit connected to be responsive to the analog signal to be digitized in parallel circuit relationship with the comparison elements for the first stage and in combination with a weighted network 36 similar to the weighted networks previously described. The network 36, however, has no normally conducting arm but has an arm corresponding to each of the comparing elements for the first stage. Therefore, each resistive impedance element and series diode combination for each arm is connected by means of a switching diode to the output circuit for an individual comparison element as described for FIG. 1, whereby the voltage provided by the network 36 when each of the elements indicate a binary zero is zero volts. When all of the comparison elements of the first stage indicate a binary zero, the analog signal to be digitized appears at the output of the summing amplifier to be operated on by the second stage. To the same end, however, whenever any one of the comparing elements of the first stage indicates a binary one for that stage, it causes the corresponding impedance element in the network 36 to be rendered conductive and to provide a voltage corresponding to the binary weight for its associated comparison element. To this end, the impedance values for each arm of the network 36 bear the relationship of 8421 reading left to right, as shown in FIG. 1. The logic of the network 36 is that the voltage signal applied to the second stage is the difference between the value indicated by the first stage and the value to be indicated by the second stage for providing the correct output indication. For example, if 256 volts is the maximum input potential to be digitized and a signal corresponding to the digit 129 is applied to the converter, the first stage will indicate 128 by switching on only the $2^7$ stage and simultaneously subtracting a voltage corresponding to this digital value from the analog signal applied to the summing amplifier 35 by switching the right-hand arm of the network 36. This then applies a voltage to the second stage corresponding to the production of a binary one for the $2^0$ element only for the second stage. A typical summing amplifier 35 is shown in FIG. 4.

The operation of the cascaded arrangement of FIG. 2 is essentially the same as that described for FIG. 1 with the exception of the modification of the analog signal as applied to the second stage. To this end, if the analog signal to be digitized assumes a voltage corresponding to the decimal digits 1 through 15, all of the elements of the first stage will indicate a binary zero while the second stage receives the analog signal from the converter and provides the digital output in the same fashion as described for FIG. 1. When the analog signal corresponds to the decimal 16, all of the elements of the second stage indicate a binary zero and the $2^4$ element is switched to indicate a binary one. The converter then indicates 00001000, reading the least significant bit first. Upon an increase in digital value, the signal applied to the summing amplifier 35 will be a signal indicative of the difference between the analog signal to be digitized and a voltage corresponding to the binary value of any one or combination of the elements $2^4$–$2^7$, whereby the signal applied to the second stage has a level corresponding to the level for triggering the correct comparing element or elements of this stage.

When the analog signal to be digitized is other than 256 volts for the arrangement of FIG. 2 or other than 16 volts for the arrangement of FIG. 1, the voltage applied to each comparison element will be modified in proportion to the actual voltage for producing the correct output in accordance with the ratios indicated herein.

Although the invention has been described in terms of binary coded digits, it should be apparent that the invention is applicable to any number system. To this end, the output indications may be coded directly in terms of the decimal number system merely by a variation of the reference voltages and the impedance values for the weighted networks 20 and 35 to produce the correct digital output indication. In the same fashion, a cascaded arrangement may be defined to provide a binary coded decimal output for any number of decimal orders desired.

An important feature of the present invention is the provision of a control arrangement for the discriminators 22 whereby they are all switched at approximately the same input signal level for a given temperature. The control arrangement comprises a single unit for all of the discriminators 22 and which unit can be conveniently characterized as a differential reference source.

Before describing the specific construction and operation of the differential reference source, the problem that may be associated with the discriminators 22 and require control will be fully examined. It is recognized that when the discriminators 22 are constructed in terms of transistor elements, the electrical characteristics of the transistors change with changes in temperature. As the temperature changes, the electrical characteristics change whereby the input signal that is effective to switch a particular transistor will be modified. It is also known that these changes in characteristics or drift generally are always in the same direction. For example, by examining FIG. 5, it will be noted that if a transistor is arranged to switch at an input level of approximately minus 3 volts, that with a temperature change, the input signal level may vary anywhere from minus 2 volts to minus 4 volts. If the analog to digital converter of the present invention is utilized in an environment subject to changing temperatures, then the discriminators will be switching at different input levels. In addition, this change is cumulative upon recalling that the discriminators are not only utilized to provide a digital output indication for a particular binary order but are utilized to control the input signal level for all of the lower ordered discriminators. Therefore, it should be apparent that some means for controlling the input signal levels to cause each of the discriminators to switch at approximately the same input level is necessary for a practical application of the invention wherein temperature changes present a problem.

Broadly, the present invention contemplates the use of a single differential reference source for each of the discriminators and which source is used for measuring the common return path for all the discriminators. A preselected current is developed by the differential reference source and is coupled to each discriminator to bias them to compensate for the changes in characteristics due to the changes in environment which may include changes in temperature or vibration. This bias is controlled to be substantially equal and opposite to the offset produced by the environmental change. With this control arrangement, each of the discriminators will switch at approximately the same input level within predetermined tolerances, despite the environmental changes and produce accurate output indications.

Figure 5:
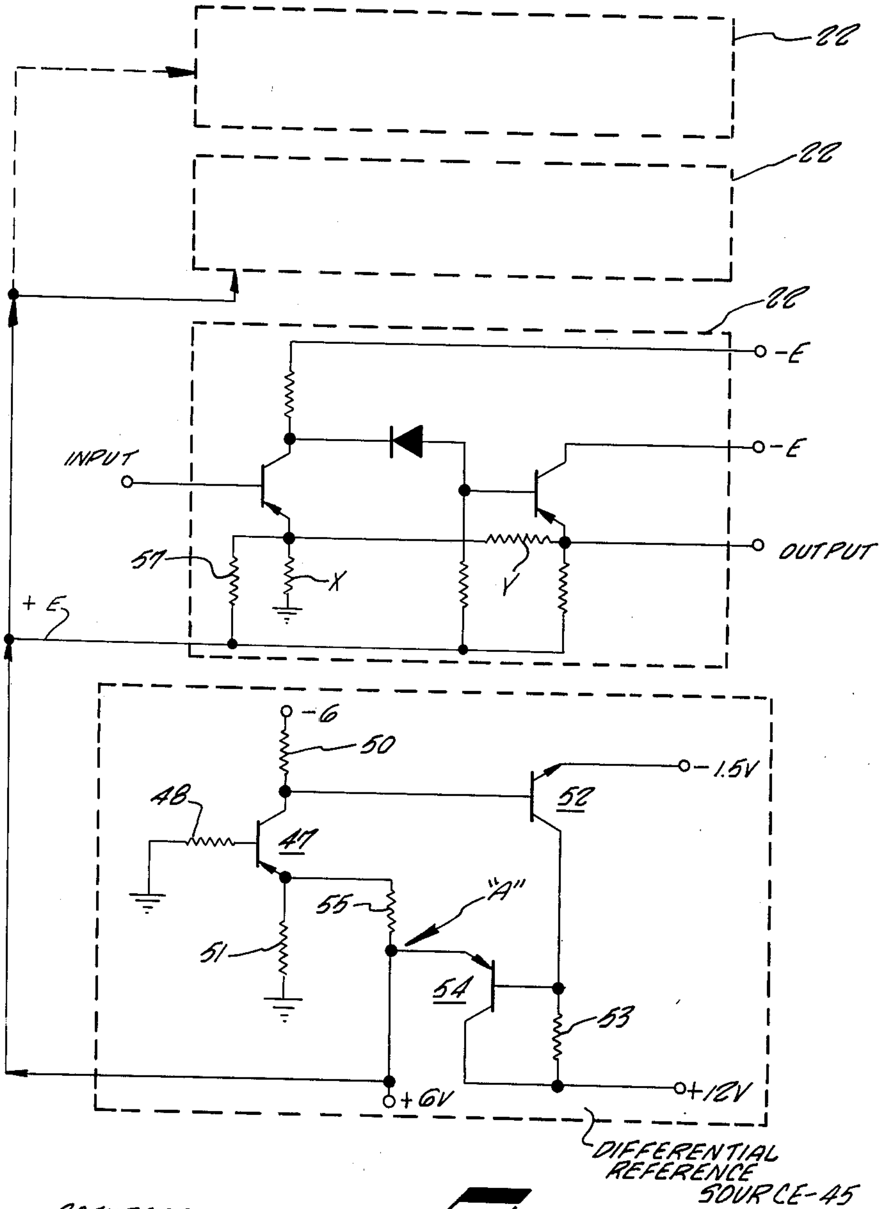
FIG. 5 is a circuit diagram of the control arrangement for the discriminators for use in the converters of FIGS. 1 and 2; and, FIG. 5A is a graph illustrating the switching characteristics of the discriminators with changes in temperature.
Figure 5A:
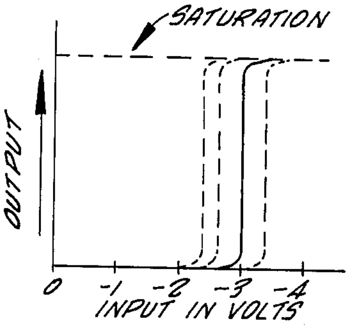

Now referring specifically to FIG. 5, the circuit details of the differential reference source 45 as utilized with the discriminators 22 will be more closely examined. The differential reference source 45 is essentially a current source comprising a transistor circuit arrangement generally similar to the trigger circuit employed for the discriminators 22 except that the output transistor element utilized for the discriminators is inverted and a negative feedback arrangement is utilized rather than positive feedback. Specifically, the differential reference source 45 comprises a first transistor 47 having its base electrode connected to a reference potential, shown as ground, through a dropping resistor 48. The collector electrode for the transistor 47 is connected to a negative potential by means of a dropping resistor 50. The emitter electrode for the transistor 47 is connected to the reference potential or ground by means of a dropping resistor 51. Another transistor 52 is arranged to have its base electrode connected directly to the collector electrode of transistor 47. The emitter electrode for this transistor 52 is connected to the negative potential source shown as minus 1.5 volts. The collector electrode for the transistor 52 is connected to a positive reference source by means of a dropping resistor 53. A third transistor 54 is utilized in the negative feedback path between the transistors 47 and 52. The base electrode of the transistor 54 is connected directly to the collector electrode of the transistor 52. The collector electrode for the transistor 54 is also directly connected to the positive potential source in common with the resistor 53. The emitter electrode for the transistor 54 is connected to a positive signal source of a different potential from its associated collector electrode and is shown as a plus 6 volt source. To complete the feedback path, this same emitter electrode is connected by means of a resistor 55 directly to the emitter electrode for the transistor 47. It should be further noted that the common junction between the resistor 55 and the emitters for the transistor 54 is shown as point "A" in FIG. 5.

It will be recognized that the input level at which the input transistor for the discriminator 22 is rendered conductive is dependent upon the potential developed across the resistor X and ground, as shown. In addition to the resistor X, each discriminator 22 includes a resistor 57 connected between the point "A" in the differential reference source 45 and the emitter electrode for the input transistor of each of the discriminators 22. The current flow through the resistor 57 is controlled by the differential reference source 45 to produce a potential across same to cause each of the discriminators 22 to trigger at a predetermined level. For example, at a common temperature, each of the discriminators 22 are arranged to be switched at approximately zero volts at the input terminals. When the transistors utilized in the discriminators 22 and the differential reference source 45 have the same temperature characteristics and the discriminators 22 are arranged in the same environment as the reference source 45, the changes in electrical characteristics of each of these transistors with the temperature variations should be approximately the same. The arrangement is such, then, that the differential reference source 45 essentially functions in the return path for all of the discriminators 22 to measure the common return signal for the discriminators and when it varies from its predetermined value as a result of a temperature change, the current provided through the resistor 57 for each of the discriminators changes in the same direction and approximately the same amount to bias the base-emitter circuit of each of these transistors in essentially an equal and opposite direction to the offset of the input signal level due to the temperature change whereby each of these discriminators 22 will operate at essentially the same signal input level.

This desired control action is provided whereby the transistors 47 and 52 comprising the source 45 are arranged to be in a conductive condition approximately midway between a nonconductive condition and a fully conducting or saturated condition. The desired conductive condition of the transistor 47 is maintained due to the negative feedback action and, as a result of this selected conductive condition, the transistor 52, in turn, is prevented from reaching saturation. Although the differential reference source 45 is shown with the transistor 54 in the feedback path between transistors 47 and 52, it should be noted that the basic circuit is operative without the use of the transistor 54. The transistor 54 primarily functions as an emitter-follower circuit and may be eliminated in a number of applications.

It therefore should be apparent that although the reference source 45 is shown in detail with a single discriminator 22, that it is equally applicable to any number of discriminator stages. In addition, this novel control arrangement is applicable wherein any number of single-ended signal receiving elements or amplifiers are used to receive an input signal substantially simultaneously as in a parallel circuit relationship, and is not restricted to the use with a discriminator or switching circuit of the type under consideration in the converter.

I claim:

1. An analog to digital converter comprising a first comparison stage having a plurality of comparators for indicating a different digital value in a preselected number system, each of the comparators being normally arranged to be in a preselected indicating condition and to be switchable to another indicating condition whereby the condition of all of the comparators define a single digit in the number system, means for applying an analog signal to be digitized to each of the comparators substantially simultaneously, said comparators each including circuit means connected to be responsive to an output indication from each of the higher valued comparators for modifying the level at which each of the lower valued comparators are responsive only when at least one of the higher valued comparators is switched to said another indicating condition to compensate for the response of said higher valued comparators to the analog signal to be digitized to provide the correct output at each of the remaining comparators to correctly digitize the corresponding portion of the analog signal, a summing circuit connected to be responsive to the analog signal to be digitized substantially simultaneously with said comparators, further circuit means connected to be responsive to the output indications from each of the comparators for providing a signal to the summing circuit corresponding to the difference between the analog signal to be digitized and the portion of the analog signal digitized by the first comparison stage, and a second comparison stage having a plurality of comparators constructed and defined the same as the comparators of the first stage and arranged in the same fashion, each of the comparators of the second stage being connected to be responsive to the output indication from the summing circuit to correctly digitize the remaining portion of the applied analog signal derived from the summing circuit.

2. An analog to digital converter comprising a first comparison stage having a plurality of comparison elements, each of the comparison elements having a voltage biased input circuit, the bias value for each element corresponding to the digit in a preselected number system that the associated element is to represent, means for applying an analog signal to be digitized to the input circuits of each of said elements, each of the comparison elements providing a digit representing output indication only when the analog signal and bias voltage have at least a preselected voltage difference, the input circuits for each of the comparison elements further including circuit means connected to be responsive to an output indication from a higher valued digit representing element to each of the lower ordered digit representing elements for modifying the bias voltage levels that each of the lower digit elements are responsive to in accordance with the digital value of the higher order element providing an output indication to compensate for the response of said higher valued comparison elements to the analog signal to be digitized to thereby provide the correct digital output representation of the analog signal, a summing circuit connected to be responsive to the analog signal to be digitized, further circuit means connected to be responsive to the output indications from each of the comparison elements for providing a signal to the summing circuit corresponding to the difference between the analog signal to be digitized and the digital output indication from the first comparison stage, and a second comparison stage having a plurality of comparison elements constructed and defined the same as the elements of the first stage and arranged in the same fashion, each of the comparison elements of the second stage being connected to be responsive to the output indication from the summing circuit.

3. An analog to digital converter comprising a first comparison stage having a plurality of comparison circuits for representing binary coded output signals of different binary orders and each being normally arranged for representing one of the binary signals and switchable for representing the other binary signal, each of the input circuits for said comparison circuits including a binary weighted network having at least a single arm for providing a bias voltage to each comparison circuit for rendering same responsive only to indicate the assigned binary order, each of the binary weighted networks including a number of additional arms corresponding to the number of higher binary ordered comparison circuits switchable into and out of the input circuits of the comparison circuits simultaneously with the switching of the comparison circuit to represent the other binary signal, means for switching each of said higher ordered arms into and out of said network, a source of reference potential connected in parallel circuit relationship with each of the arms of said networks, means for applying an analog signal to be digitized to the input circuits for each of the comparison circuits, a summing circuit connected to be responsive to the analog signal to be digitized, further circuit means connected to be responsive to the output indications from each of the comparison circuits for providing a binary weighted signal to the summing circuit corresponding to the binary order of the comparison circuit only when a comparison circuit has been switched to represent the other binary signal thereby causing the output signal from the summing circuit to have a value corresponding to the difference between the analog signal to be digitized and the total digital output indication from the first comparison stage, and a second comparison stage for digitizing the portion of the analog signal represented by the output of said summing circuit, said second comparison stage having a plurality of comparison circuits constructed and defined the same as the circuits of the first stage and arranged in the same fashion, each of the comparison circuits of the second stage being connected to be responsive to the output indication from the summing circuit and in parallel circuit relationship with said source of reference potential.

4. An analog to digital converter as defined in claim 1 including a differential reference source for measuring the common return path for all of the comparators and connected to each of the comparators for applying a compensating signal to each for offsetting the effect in each due to changes in environment whereby whereby each of the comparators are switched at approximately the same input signal level.

5. An analog to digital converter as defined in claim 1 wherein each of the comparators comprise a transistor voltage discriminator circuit arrangement arranged to be switched at substantially the same preselected input signal level and which input signal level is subject to change with changes in environmental temperature, and including a differential reference source comprising a transistor circuit arrangement and which transistors have essentially the same temperature characteristic as the transistors for the comparators, said source being defined to have a response characteristic opposite to that of the comparators with temperature changes and connected to each of the comparators in a fashion to compensate for the change of input level due to temperature changes.

6. An analog to digital converter as defined in claim 3 wherein each said comparator circuit includes a voltage discriminator responsively connected to a respective input circuit, each said voltage discriminator comprising:

A normally nonconductive input transistor and a normally conductive output transistor, said input transistor being responsively connected to said input circuit to become conductive in accordance with a preselected voltage difference between said analog signal and said bias voltage, and positive feedback circuit coupled between said output transistor and said input transistor for switching said input and output transistors, the amount of feedback in said positive feedback circuit being defined as the hysteresis characteristic of said voltage discriminator.

7. In an analog to digital converter:

a plurality of comparison stages of descending order;

each of said comparison stages comprises a plurality of comparators for indicating a different digital value in a preselected binary number system;

each of the comparators being normally arranged to be in a preselected indicating condition and to be switchable to another indicating condition whereby the condition of all the comparators define a single binary digit in the number system;

each of said comparators including:

individual input circuit means directly connected to be responsive to an output indication from each of the higher valued comparators for modifying the input response of each of the lower valued comparators only when at least one of the higher valued comparators is switched to said another indicating condition to provide the correct output at each of the remaining comparators to correctly digitize the applied analog signal, and means for applying an analog signal to be digitized to each of the comparators substantially simultaneously by means of said individual input circuits;

a summing circuit connected to be responsive to the analog signal to be digitized;

further circuit means connected to be responsive to the output indications from each of the comparators for providing a binary weighted signal to the summary circiut corresponding to the binary order of the comparator;

and means for applying the portion of the analog signal represented by the output of said summary circuit to a lower order comparison stage to comprise the analog signal to be digitized by said lower order comparison stage.

References Cited by the Examiner

UNITED STATES PATENTS

| | | | |
|---|---|---|---|
| 2,897,486 | 7/1959 | Alexander et al. | 340—347 |
| 2,941,196 | 6/1960 | Raynsford et al. | 340—347 |
| 3,019,426 | 1/1962 | Gilbert | 235—154 XR |
| 3,038,091 | 6/1962 | Clapper | 307—88.5 |
| 3,041,469 | 6/1962 | Ross | 340—347 |
| 3,050,644 | 8/1962 | Ironside | 307—88.5 |
| 3,100,298 | 8/1963 | Fluhr | 340—347 |

MALCOLM A. MORRISON, *Primary Examiner.*